United States Patent
Brkovic et al.

(10) Patent No.: US 6,838,898 B2
(45) Date of Patent: Jan. 4, 2005

(54) APPARATUS AND METHOD FOR TESTING HIGH CURRENT CIRCUIT ASSEMBLIES

(75) Inventors: Milivoje Slobodan Brkovic, Carlsbad, CA (US); Milan Stefanovic, Carlsbad, CA (US); Jovan Zivkovic, Carlsbad, CA (US)

(73) Assignee: di/dt, Inc., Carlsbad, CA (US)

( * ) Notice: Subject to any disclaimer, the term of this patent is extended or adjusted under 35 U.S.C. 154(b) by 197 days.

(21) Appl. No.: 10/053,135

(22) Filed: Jan. 17, 2002

(65) Prior Publication Data

US 2003/0132773 A1 Jul. 17, 2003

(51) Int. Cl.⁷ .............................................. G01R 31/02
(52) U.S. Cl. ...................................... 324/761; 324/754
(58) Field of Search ................................ 324/754, 755, 324/757, 758, 761, 765; 439/55, 65, 66, 74, 75, 78

(56) References Cited

U.S. PATENT DOCUMENTS

| | | | | |
|---|---|---|---|---|
| 4,267,506 A | * | 5/1981 | Shiell | 324/761 |
| 4,818,933 A | * | 4/1989 | Kerschner et al. | 324/754 |
| 4,926,119 A | * | 5/1990 | Prokopp | 324/761 |

* cited by examiner

Primary Examiner—David Zarneke
Assistant Examiner—Russell M. Kobert
(74) Attorney, Agent, or Firm—Lowenstein Sandler PC

(57) ABSTRACT

The invention is a test apparatus incorporating high current test pins, forced into contact with a circuit assembly under test by opposing compliant pressure pins. An advantageous test pin for low voltage, high current testing is a solid, one piece test pin. The solid test pin, when supplied with adequate contact force, provides both low resistance and low inductance. The required compliant force is applied to the test circuit, opposite and substantially in line with the solid test pin, by a compliant pressure pin. Since the test pin does not supply the compliant force, it can be designed primarily for the desired electrical parameters of the test contact. The only mechanical considerations for the conductive solid pin are the amount of desired surface contact area, the dominant mechanical parameter in setting the contact resistance, and the body dimensions, which determine the resistance and inductance of the pin itself. And since, the opposing compliant pressure pin is not part of the electrical test circuit, it can be designed for its mechanical properties alone. The advantage of the conductive pin—compliant pressure pin pair over the prior art compliant pin is that the compliant element, usually a spring, is no longer part of the test circuit. Also, a much higher contact force is achievable, resulting in significantly lower contact resistance.

12 Claims, 5 Drawing Sheets

APPARATUS AND METHOD FOR TESTING HIGH CURRENT CIRCUIT ASSEMBLIES

FIELD OF THE INVENTION

The invention pertains to an apparatus and method for testing circuit assemblies. The apparatus and method are particularly useful for testing low voltage, high current circuit assemblies.

BACKGROUND OF THE INVENTION

In the testing of high current (above 10 Amperes) electronic circuit assemblies it is essential that a good electrical contact be established between the test apparatus test pins and the electronic circuit assembly test points. The electrical test pins must make good mechanical contact and be capable of withstanding high current to ensure low resistance to the test apparatus. While it is desirable to limit contact signal loss at any voltage, low resistance contacts are particularly advantageous at low voltages. At low voltages (below 5 volts) the loss of a substantial part of the available test signal voltage through test contacts can cause the test to fail. Additionally, for fast and flexible testing in various environments including, production, laboratory, burn-in, and repair, these connections need to be quickly established and quickly released.

Conventional circuit assembly test fixtures incorporate a test bed to make electrical contact at a plurality of points to the circuit assembly under test. The mechanical test probes in the test bed, called test pins, are used to make electrical contact with the circuit assembly at each circuit assembly test point, usually an exposed metal or solder tinned surface area, referred to as a pad.

When the circuit assembly is mounted in the test fixture, each test pin to contact pad connection can be characterized by electrical parameters. The resistance and inductance of the test connection are of particular interest for low voltage, high current signal test points where it is desirable to minimize both of these parameters.

As circuit assemblies to be tested are inserted and removed from the test bed, test pins must repeatedly make reliable mechanical and electrical connection between the test pins and the appropriate contact pads on the circuit assembly under test. These connections are made many times, particularly in the case of automatic test equipment.

Conventional test points incorporate a mechanical means to make and maintain contact with circuit assemblies of varying mechanical tolerances. Such test points, known as compliant test points, incorporate a sliding plunger supported by a spring in a hollow test point receptacle base. Each time a circuit assembly is placed in the test bed, the spring compresses as necessary to make mechanical contact between the compliant test pin and the test point contact pad. Referring to the drawings, FIG. 1 shows a test fixture 10 based on prior art compliant pins. Circuit assembly 12 is held in place by flange 11. The sliding plunger pins 14 extend to contact the circuit assembly pads 13.

Sliding plunger pin 14 is held against a test point pad 13 by the small force of spring 15, residing in the compliant pin hollow test point receptacle base 16. Since the spring 15 is located inside the hollow test pin base 16, it must be relatively small. Because of its small size, the internal spring 15 applies only a small force to the test pin 14. This small contact force results in a higher contact resistance than would be obtained with a stronger spring force.

In addition to the contact force, the resistance and inductance of the test connection are a function of the physical structure of the compliant pin. There are two electrical conduction paths within the structure of a compliant pin. The first is the direct path through any overlapping regions of the hollow cylindrical structure of the base receptacle and the plunger test pin. The second path is from the base receptacle through the spring to the test point. In parallel circuits, the combined resistance and inductance is lower than the either path alone, but the net resistance and inductance of this structure is still relatively high due to its small physical size.

An additional problem with the compliant test pin is that that the quality of the electrical connection deteriorates as spring and sliding plunger mechanically cycle with test circuit assembly insertion and removal. The increase in resistance is due to both a reduction in test pin spring force due to annealing and the deterioration of the surface contact between the test pin spring and the hollow base receptacle, and between the base receptacle and the test pin. Eventually, the resistance and inductance rises to a point where the voltage drop developed at the connection is so high that it precludes further testing without replacement of the failed compliant pin.

Accordingly, a need exists for a test instrument having low voltage, high current test pins that provide relatively constant low resistances and inductances that are stable over time and do not deteriorate with insertion cycles.

SUMMARY OF THE INVENTION

The invention is a test apparatus incorporating high current test pins, forced into contact with a circuit assembly under test by opposing compliant pressure pins. An advantageous test pin for low voltage, high current testing is a solid, one piece test pin. The solid test pin, when supplied with adequate contact force, provides both low resistance and low inductance. The required compliant force is applied to the test circuit, opposite and substantially in line with the solid test pin, by a compliant pressure pin. Since the test pin does not supply the compliant force, it can be designed primarily for the desired electrical parameters of the test contact. The only mechanical considerations for the conductive solid pin are the amount of desired surface contact area, the dominant mechanical parameter in setting the contact resistance, and the body dimensions, which determine the resistance and inductance of the pin itself. Since the opposing compliant pressure pin is not part of the electrical test circuit, it can be designed for its mechanical properties alone. The advantage of the conductive pin—compliant pressure pin pair over the prior art compliant pin is that the compliant element, usually a spring, is no longer part of the test circuit. Also, a much higher contact force is achievable, resulting in significantly lower contact resistance.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

It is to be understood that these drawings are for purposes of illustrating the concepts of the invention and are not to scale.

DETAILED DESCRIPTION

Figure 1:
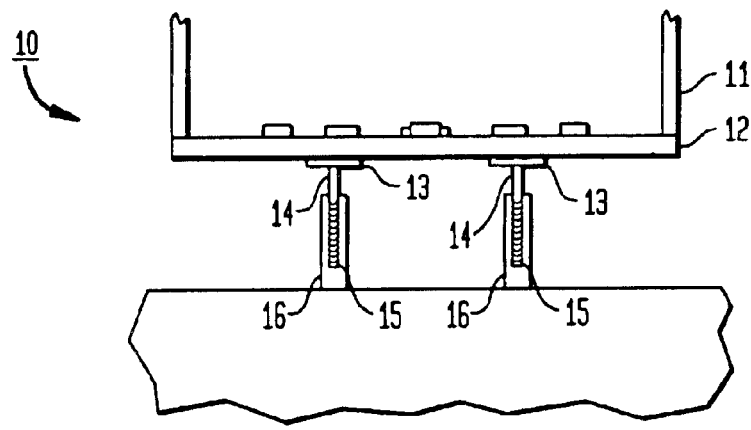
FIG. 1 depicts a prior art test apparatus.
Figure 2:
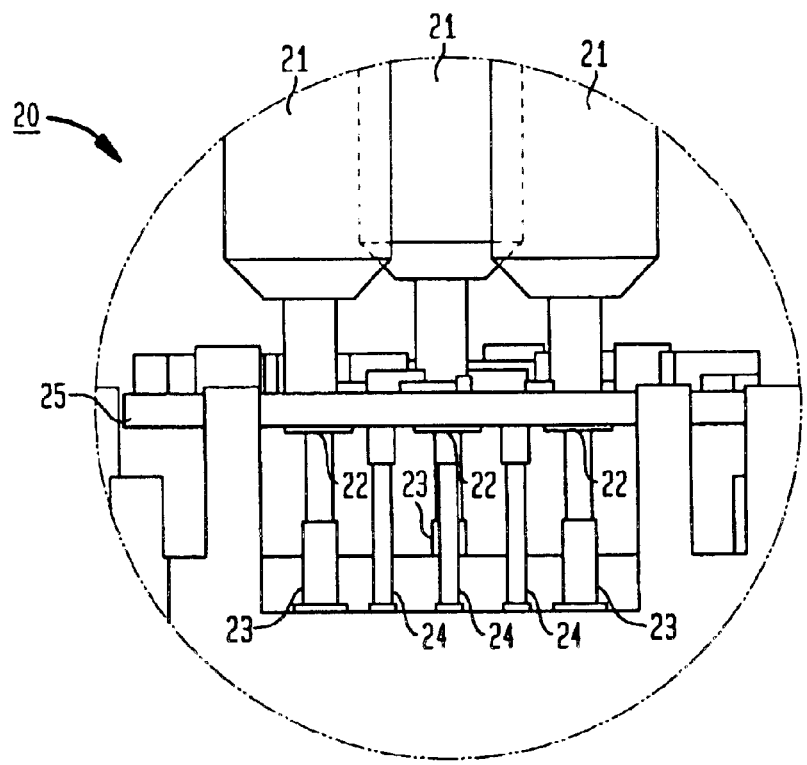
FIG. 2 depicts a test apparatus in accordance with a first embodiment of the invention.

Referring to the drawings, FIG. 2 shows a test fixture apparatus 20 comprising a plurality of conductive pins 23 (three shown here) and corresponding compliant pressure pins 21. The conductive pins are advantageously solid, unitary metal pins. The conductive pins 23 make contact with the corresponding test point contact pads 22 that are part of the circuit assembly under test 25. Additional low current test points can be contacted by conventional compliant test points 24. The conductive pins 23 can be mounted in a base member. The base member can be insulating or alternatively, the pins 23 can be coated, or covered with insulation to isolate the individual test circuits.

Figure 3:
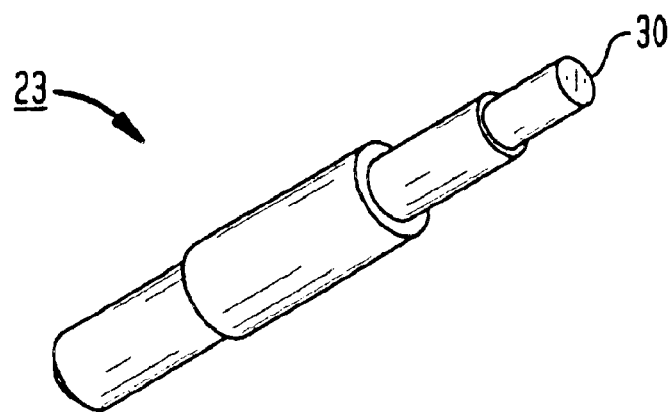
FIG. 3 is a perspective view of a conductive pin useful in the apparatus of FIG. 2.
Figure 3A:
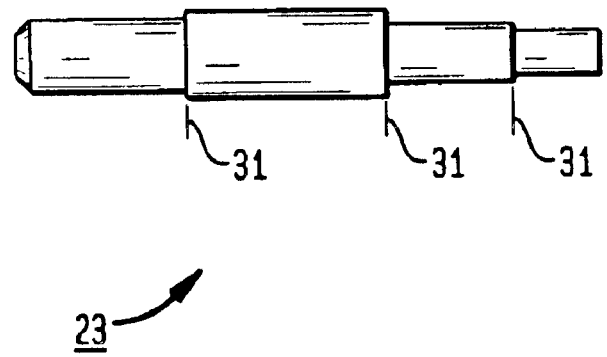
FIG. 3A is a side view of the pin in FIG. 3.

FIG. 3 is a perspective view showing a conductive high current test pin 23 useful in the apparatus of FIG. 2. Conductive pin contact surface 30 is of sufficient surface area for the desired contact resistance. FIG. 3A, a side view of a conductive pin, shows optional shoulders 31 used to locate the pin in the test fixture and in the test circuit assembly. The conductive pin is advantageously a conductive metal, typically gold or silver plated brass or copper, or silver plated nickel, but may be composed of other conductive materials or materials with a conductive plating.

Figure 4:
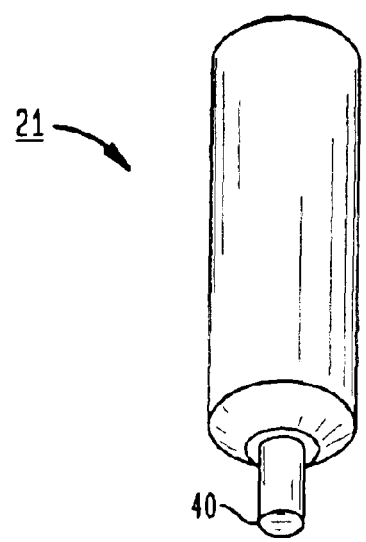
FIG. 4 is a perspective view of a compliant pressure pin useful in the apparatus of FIG. 2.
Figure 4A:
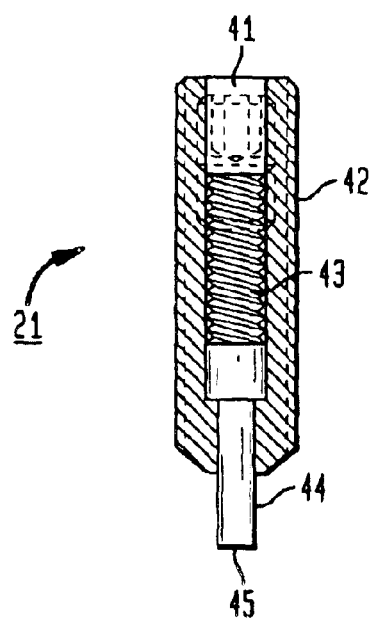
FIG. 4A is a cut-away side view of the pin in FIG. 4.

FIG. 4 is a perspective view showing a compliant pressure pin 21 useful in the apparatus of FIG. 2. Compliant pin pressure surface 40 holds the circuit assembly under test against the corresponding contact surface of a conductive pin 23. FIG. 4A is a side view of the compliant pressure pin depicted in FIG. 4, showing an embodiment where the compliant member is a spring 43, which applies pressure to plunger 44 with pressure surface 45 that acts on the circuit assembly under test. A retainer 41 supports a resilient element, here spring 43. The resilient element can also be made of resilient materials such as rubber. The compliant pressure pin base 42 is typically a plastic, thermoplastic, nylon, epoxy, glass epoxy, or metal, but is not limited to those materials. The compliant pressure pins are not a part of the electrical test circuit, therefore their electrical parameters need not be considered. In some embodiments, it may be desirable to avoid ferrous materials, so as to minimize the inductance of various nearby structures in the test circuits.

The resistance of the conductive pin 23 to test circuit assembly pad 22 is typically in the range from 0.1 to 0.5 milliohms, depending on the surface area of the contact surface of the pad, the contact force caused by the opposing compliant pressure pin 21, and the physical dimensions of pin 23. The inductance of the conductive pin 23 is typically in the range of 2 to 10 nanohenrys.

Figure 5:
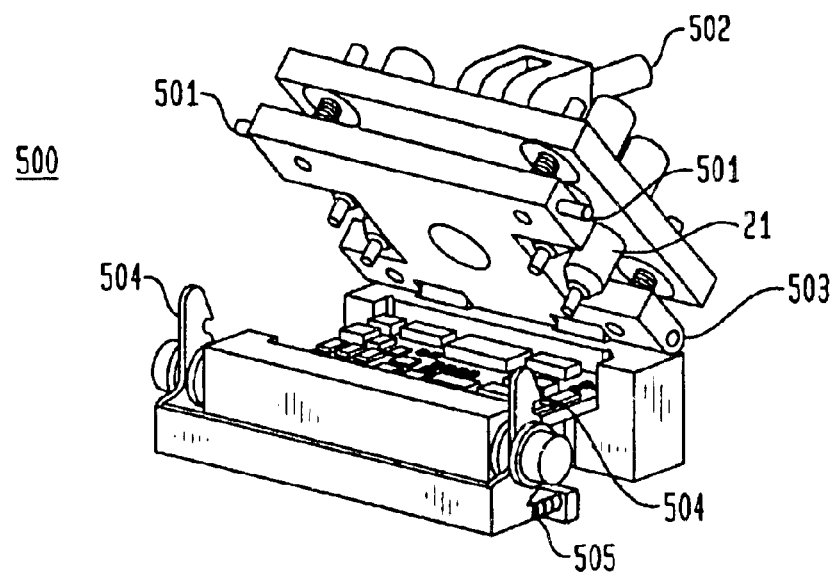
FIG. 5 is a perspective view of an embodiment of the invention in a clamp type test fixture.

FIG. 5 shows a clamp type embodiment of the inventive test apparatus 500. The test fixture cover is hinged by hinges 503, and a plate, holding the compliant pressure pins 21, is held in a closed position for testing by latches 504 and pins 501. The latches 504 are held closed by springs 505. The latches 504 are released by lever 502, to remove the test circuit assembly.

Figure 5A:
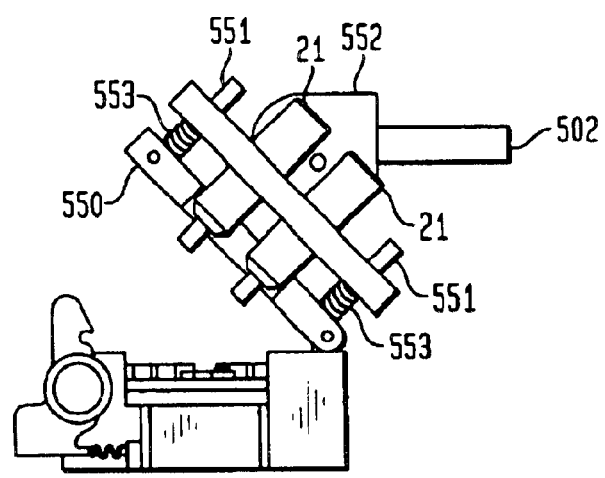
FIG. 5A is a side view of FIG. 5.

FIG. 5A shows a side view of the FIG. 5 embodiment. Here, the plate is supported above the test fixture top cover, supported on posts 551. When the lever 502 is closed, cam 552 lowers the plate into place and is held locked by springs 553. In this embodiment, the compliant force applied to hold the circuit assembly under test to the corresponding stationary pin is applied by the resilient elements in the compliant test pins 21 and not by springs 553.

Figure 6:
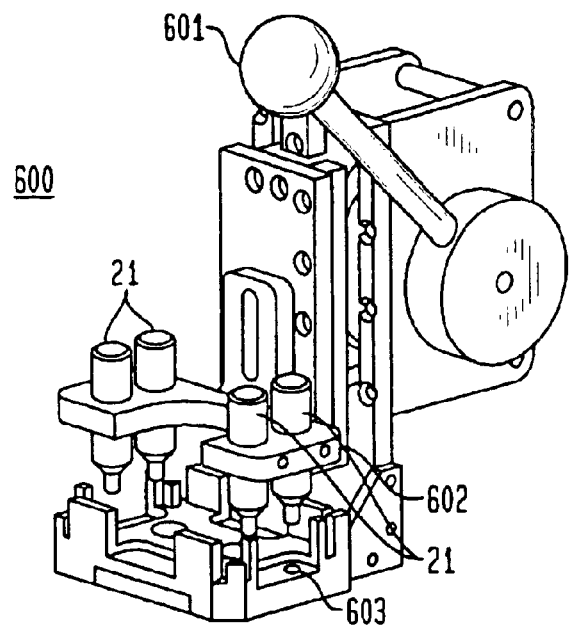
FIG. 6 is a perspective view of a second embodiment of the invention in a press type test fixture.
Figure 6A:
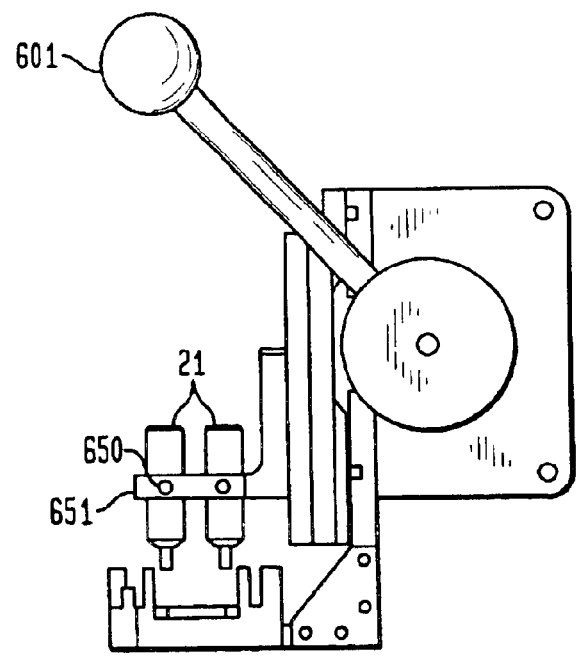
FIG. 6A is a side view of FIG. 6.

FIG. 6 shows a press type embodiment of the inventive test apparatus 600 with a plurality of compliant pressure pins (here four) 21 held in plate 602 and a plurality of holes 603 (only one of which is unobstructed and shown in this view) as an optional means for locating conductive test pins (not shown). Here, press handle 601 lowers the plate, applying force to the test circuit to press its contact pads (not shown) onto the corresponding stationary test pins (not shown) as illustrated in FIG. 2. FIG. 6A shows a side view of FIG. 6. In this embodiment, the compliant pressure pins 21 are optionally mounted by their base element in holes 651 sized to accept the pins 21, and affixed in place by set screws 650 normal to the base element.

The invention can now be understood more clearly by consideration of the following specific embodiment.

EXAMPLE

In the preferred application, the circuit assembly under test is a small rigid printed circuit board. In this case, the number of conductive high current test points that can be used is in the range of one to three. There is a maximum number of three conductive points because the rigid board will sit in the plane established by the height of the three non-collinear points, with any remaining standard test point locations being satisfied by conventional compliant pins. Conventional pins are then employed for additional low current test points and extend as needed to make contact with low current test points that fall in the plane in which the board sits as suspended by the conductive pins.

In a specific embodiment, the conductive pins as shown in FIGS. 3 and 3A were made of brass plated with nickel followed by gold. The axial length of each pin extending between the circuit assembly under test and the test apparatus was 0.610 inches. The diameter of the pin ranged from 0.062 inches to 0.125 inches. The resistance of the pin was 0.3 milliohms and the inductance was 8 nanohenrys.

In other embodiments, a plurality of more than 3 pins may be used. One such embodiment is where the circuit board under test is a flexible, as opposed to a solid structure. Another embodiment allowing more than 3 conductive pins is where the board is large enough such that for the material the board is constructed of it can flex enough to allow multiple planes of stationary pins. An example is a long and narrow circuit board with low voltage, high current test points at both ends of the board.

In some embodiments of the invention, the circuit assembly under test is oriented in planes other than horizontal. In this case a base member in a plane other than the horizontal, supports, or incorporates as integral parts, a plurality of conductive test pins. A plate in a plane essentially parallel to the base then supports, or incorporates as integral parts, the corresponding compliant pressure pins. The test fixture and circuit assembly under test may be oriented and operated in any plane in space.

It is understood that the above-described embodiments are illustrative of only a few of the many possible specific embodiments, which can represent applications of the invention. Numerous and varied other arrangements can be made by those skilled in the art without departing from the spirit and scope of the invention.

What is claimed is:

1. An apparatus for testing a circuit assembly including a plurality of test pads comprising:
   a test fixture base comprising a plurality of conductive pins having contact surfaces defining a first plane, the conductive pins free of electrical contact with resilient compression elements;
   a test fixture plate in a plane substantially parallel to said first plane, comprising a plurality of compliant pressure pins, the compliant pressure pins substantially aligned with the conductive pins;
   each conductive pin having a main pin axis and a contact surface for contacting a pad on the circuit assembly, said main pin axis substantially normal to the circuit assembly;
   each compliant pressure pin having a main pressure pin axis and a pressure surface, said compliant pressure pin having a resilient compression element,
   wherein the pressure surfaces and the respective contact surfaces are moveable in relation to each other to force the circuit assembly pad onto the contact surface of said conductive pins allowing a test current to pass directly through said conductive pins without passing through resilient compression elements.

2. A test apparatus according to claim 1 wherein said test fixture base has a maximum of three conductive pins.

3. A test apparatus according to claim 1 wherein said resilient compression element comprises a spring.

4. A test apparatus according to claim 1 wherein said resilient compression element comprises rubber.

5. A test apparatus according to claim 1 wherein each conductive pin comprises a metal selected from the group consisting of brass, copper, nickel, silver, and gold.

6. A test apparatus according to claim 1 wherein each conductive pin comprises a cylinder.

7. A test apparatus according to claim 1 wherein each conductive pin comprises a plurality of cylinders forming a plurality of shoulders for locating said conductive pin in a test fixture base.

8. A test apparatus according to claim 1 wherein said conductive pin has a resistance in the range of 0.1 to 0.5 milliohms.

9. A test apparatus according to claim 1 wherein said conductive pin has an inductance in the range of 2 to 10 nanohenrys.

10. A method for testing a circuit assembly having a plurality of test pads which comprises:
   (a) contacting a plurality of conductive test pins to corresponding test pads of the circuit assembly, the conductive test pins free of electrical contact with resilient compression elements;
   (b) pressing the circuit assembly test pads against the conductive test pins by a plurality of compliant pressure pins, each compliant pressure pin applying force to the assembly substantially in line with a corresponding test pin; and
   (c) applying a test current to the circuit assembly through the test pins without passing through resilient compression elements.

11. The method of claim 10 wherein each of the conductive test pins is a solid metal test pin.

12. The method of claim 10 wherein: the test circuit assembly is supported on a maximum of three conductive test pins, said conductive test pins establishing the plane in which the circuit assembly resides.

* * * * *